US012335648B2

United States Patent
Kawada

(10) Patent No.: US 12,335,648 B2
(45) Date of Patent: Jun. 17, 2025

(54) SOLID-STATE IMAGING DEVICE, VEHICLE CONTROL SYSTEM, AND CONTROL METHOD FOR SOLID-STATE IMAGING DEVICE

(71) Applicant: SONY SEMICONDUCTOR SOLUTIONS CORPORATION, Kanagawa (JP)

(72) Inventor: Makoto Kawada, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 228 days.

(21) Appl. No.: 18/004,202

(22) PCT Filed: May 19, 2021

(86) PCT No.: PCT/JP2021/018967
§ 371 (c)(1),
(2) Date: Jan. 4, 2023

(87) PCT Pub. No.: WO2022/014149
PCT Pub. Date: Jan. 20, 2022

(65) Prior Publication Data
US 2023/0300487 A1    Sep. 21, 2023

(30) Foreign Application Priority Data
Jul. 14, 2020  (JP) ................. 2020-120321

(51) Int. Cl.
*H04N 25/75*   (2023.01)
*H04N 25/772*  (2023.01)
*H04N 25/779*  (2023.01)

(52) U.S. Cl.
CPC .......... *H04N 25/75* (2023.01); *H04N 25/772* (2023.01); *H04N 25/779* (2023.01)

(58) Field of Classification Search
CPC ..... H04N 25/75; H04N 25/779; H04N 25/772
See application file for complete search history.

(56) References Cited

U.S. PATENT DOCUMENTS

2019/0394414 A1* 12/2019 Kawazu ............... H04N 17/002

FOREIGN PATENT DOCUMENTS

| JP | 11-039181 A   | 2/1999  |
| JP | 11-154101 A   | 6/1999  |
| JP | 2010-256130 A | 11/2010 |

(Continued)

OTHER PUBLICATIONS

International Search Report and Written Opinion of PCT Application No. PCT/JP2021/018967, issued on Jul. 27, 2021, 09 pages of ISRWO.

*Primary Examiner* — Lin Ye
*Assistant Examiner* — Fayez A Bhuiyan
(74) *Attorney, Agent, or Firm* — CHIP LAW GROUP

(57) ABSTRACT

Provided is a solid-state imaging device that includes an analog-to-digital converter, a signal processing circuit, and a scan test circuit. The analog-to-digital converter generates a digital signal within a predetermined video period. The signal processing circuit performs predetermined signal processing on the digital signal during the video period. The scan test circuit performs a scan test on the signal processing circuit during a vertical blanking period that does not correspond to the video period.

6 Claims, 22 Drawing Sheets

(56) References Cited

FOREIGN PATENT DOCUMENTS

| | | |
|---|---|---|
| JP | 2015-038473 A | 2/2015 |
| JP | 2019-113353 A | 7/2019 |
| WO | 2012/046602 A1 | 4/2012 |

* cited by examiner

Fig. 11

| ScanOUT | 0 | 1 | 0 | 1 | 1 | ... |
|---|---|---|---|---|---|---|
| COMPRESSED DATA | | | | 1 | 1 | ... |
| EXPECTED VALUE | | | | 0 | 1 | ... |
| ERROR NOTIFICATION | ABNORMALITY IN AND GATE NO ABNORMALITY IN OR GATE | | | | | |

SOLID-STATE IMAGING DEVICE, VEHICLE CONTROL SYSTEM, AND CONTROL METHOD FOR SOLID-STATE IMAGING DEVICE

CROSS REFERENCE TO RELATED APPLICATIONS

This application is a U.S. National Phase of International Patent Application No. PCT/JP2021/018967 filed on May 19, 2021, which claims priority benefit of Japanese Patent Application No. JP 2020-120321 filed in the Japan Patent Office on Jul. 14, 2020. Each of the above-referenced applications is hereby incorporated herein by reference in its entirety.

TECHNICAL FIELD

The present technology relates to a solid-state imaging device. More specifically, the present invention relates to a solid-state imaging device for detecting the presence/absence of circuit faults, a vehicle control system, and a control method for the solid-state imaging device.

BACKGROUND ART

From the viewpoint of ensuring safety and reliability, solid-state imaging devices used in in-vehicle cameras in particular have been required to have a BIST (Built-In Self Test) function that detects the presence/absence of faults in the device itself. For example, a solid-state imaging device has been proposed in which two circuits, a path for processing pixel data and a path for processing test data having the same value as the pixel data, are provided, and the results from the respective paths are compared to detect the presence/absence of circuit faults (see, for example, PTL 1).

CITATION LIST

Patent Literature

[PTL 1]
JP H11-154101 A

SUMMARY

Technical Problem

In the conventional technology described above, the presence/absence of a circuit fault is detected during imaging by comparing the results from the two paths. However, in the solid-state imaging device described above, it is necessary to simultaneously drive the circuits forming the two paths during imaging, which may increase power consumption compared to driving only one path.

The present technology has been made in view of such circumstances, and an object thereof is to reduce power consumption in a solid-state imaging device that detects the presence/absence of faults during imaging.

Solution to Problem

The present technology has been made to solve the above-described problems, and a first aspect thereof provides a solid-state imaging device including: an analog-to-digital converter that generates a digital signal within a predetermined video period; a signal processing circuit that performs predetermined signal processing on the digital signal within the video period; and a scan test circuit that performs a scan test on the signal processing circuit during a vertical blanking period that does not correspond to the video period, and a control method thereof. This brings about the effect of detecting the presence/absence of faults in the signal processing circuit.

In this first aspect, the scan test circuit may perform the scan test in each of a plurality of frame periods each including the vertical blanking period, and output an error notification indicating presence/absence of a fault in the signal processing circuit based on each test result. This brings about the effect of improving the fault detection rate.

In the first aspect, the solid-state imaging device may further include a test pattern generation circuit that generates a predetermined test pattern based on an input seed value and inputs the test pattern to the signal processing circuit, and the scan test circuit may change the seed value each time a frame period elapses. This brings about the effect that the test pattern is changed every frame period.

In this first aspect, the scan test circuit may include first and second test circuits, the signal processing circuit may include first and second processing units, the first test circuit may perform a scan test on the first processing unit, and the second test circuit may perform a scan test on the second processing unit. This brings about the effect of shortening the time required for the scan test.

In the first aspect, the solid-state imaging device may further include a fault detection circuit that detects presence/absence of a fault in the scan test circuit. This brings about the effect of improving the fault detection rate of the circuit to be subjected to the scan test.

In the first aspect, the solid-state imaging device may further include a test pattern generation circuit that generates a predetermined test pattern based on an input seed value and inputs the test pattern to the signal processing circuit, and the signal processing circuit may include: a predetermined number of scan flip-flops; and a combinational circuit that performs a predetermined logic operation on data output from the scan flip-flop. This brings about the effect of detecting the fault in the combinational circuit.

A second aspect of the present technology provides a vehicle control system including: a solid-state imaging device including an analog-to-digital converter that generates a digital signal within a predetermined video period, a signal processing circuit that performs predetermined signal processing on the digital signal within the video period, and a scan test circuit that performs a scan test on the signal processing circuit during a vertical blanking period that does not correspond to the video period; and a control unit that stops the solid-state imaging device based on the result of the scan test. This brings about the effect of improving the safety and reliability of the vehicle control system.

BRIEF DESCRIPTION OF DRAWINGS

FIG. 11 is a diagram showing an example of test results, compressed data, expected values, and error notification according to the first embodiment of the present technology.

DESCRIPTION OF EMBODIMENTS

Modes for carrying out the present technology (hereinafter also referred to as "embodiments") will be described below. The description will be given in the following order.
 1. First Embodiment (Example of performing scan test within vertical blanking period)
 2. Second Embodiment (Example of performing scan test within vertical blanking period and changing test pattern every frame)
 3. Third Embodiment (Example of performing scan test in parallel on plurality of processing units within vertical blanking period)
 4. Fourth Embodiment (Example of performing scan test within vertical blanking period and detecting fault in scan test circuit)
 5. Example of application to moving body 1. First Embodiment

[Configuration Example of Vehicle Control System]

Figure 1:
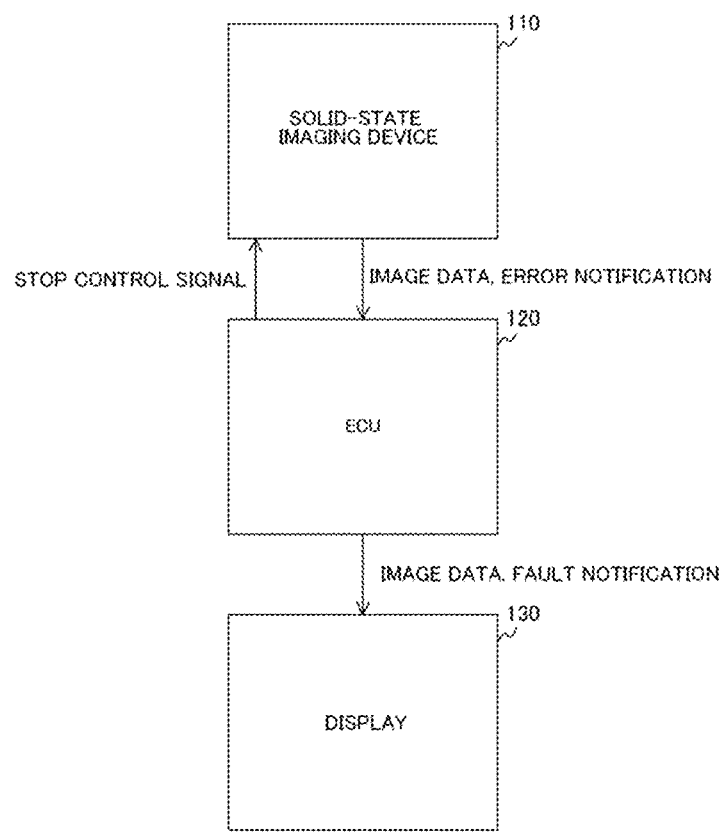
FIG. 1 is a block diagram showing a configuration example of a vehicle control system according to a first embodiment of the present technology.

FIG. 1 is a block diagram showing a configuration example of a vehicle control system according to a first embodiment of the present technology. This vehicle control system is a system for controlling a moving body such as an automobile, and includes a solid-state imaging device 110, an ECU (Electronic Control Unit) 120 and a display 130.

The solid-state imaging device 110 captures image data in synchronization with a vertical synchronization signal. The vertical synchronization signal is a periodic signal that instructs the timing of imaging. The frequency of the vertical synchronization signal is set to 30 hertz (Hz), for example.

The solid-state imaging device 110 supplies captured image data to an ECU 120. The solid-state imaging device 110 detects the presence/absence of its own fault, and supplies an error notification indicating the detection result to the ECU 120. The fault detection timing will be described later.

The ECU 120 electronically controls in-vehicle equipment and devices such as a camera incorporating the solid-state imaging device 110. The ECU 120 causes a display 130 to display the image data (in other words, frames) captured by the solid-state imaging device 110. When a fault occurs in the solid-state imaging device 110, the ECU 120 supplies a stop control signal to the solid-state imaging device 110 to stop the imaging operation, and causes the display 130 to display the fact that the fault has occurred and the details of the fault. The ECU 120 is an example of a control unit described in the claims.

The display 130 displays various pieces of data such as image data. The ECU 120 can also mask a black image or the like without stopping the solid-state imaging device 110 when a fault occurs.

Although the solid-state imaging device 110 is provided in a vehicle control system, the solid-state imaging device 110 can also be provided in systems and devices other than the vehicle control system. For example, the solid-state imaging device 110 may be provided in an FA (Factory Automation) system.

[Configuration Example of Solid-State Imaging Device]

Figure 2:
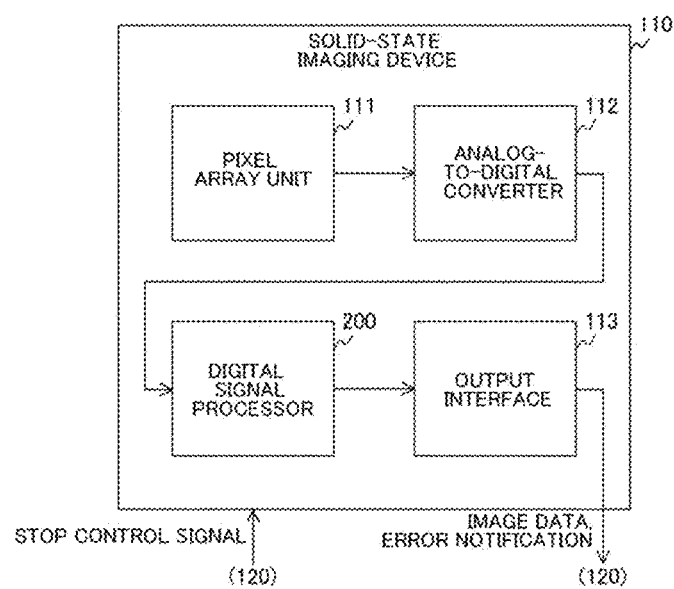
FIG. 2 is a block diagram showing a configuration example of a solid-state imaging device according to the first embodiment of the present technology.

FIG. 2 is a block diagram showing a configuration example of the solid-state imaging device 110 according to the first embodiment of the present technology. This solid-state imaging device 110 includes a pixel array unit 111, an analog-to-digital converter 112, a digital signal processor 200 and an output interface 113.

A plurality of pixels are arranged in the pixel array unit 111 in a two-dimensional grid pattern. Each of the pixels generates an analog pixel signal by photoelectric conversion during the video period and outputs the analog pixel signal to the analog-to-digital converter 112. Here, the video period is a period that does not correspond to the vertical blanking period within the frame period having the same length as the period of the vertical synchronization signal.

The analog-to-digital converter 112 converts the pixel signal into a digital signal during the video period and supplies the digital signal to the digital signal processor 200.

In the analog-to-digital converter 112, for example, an ADC (Analog to Digital Converter) is arranged for each column of the pixel array unit 111, and each ADC performs AD (Analog to Digital) conversion on the pixel signal of the corresponding column.

The digital signal processor 200 performs various kinds of signal processing such as white balance correction and demosaic processing on the digital signal from the analog-to-digital converter 112 during the video period. The digital signal processor 200 supplies image data in which processed digital signals are arranged to the output interface 113.

The digital signal processor 200 detects the presence/absence of a fault in its own circuit within the vertical blanking period, and supplies an error notification indicating the detection result to the output interface 113.

The output interface 113 outputs the image data and error notification to the ECU 120.

[Configuration Example of Digital Signal Processor]

Figure 3:
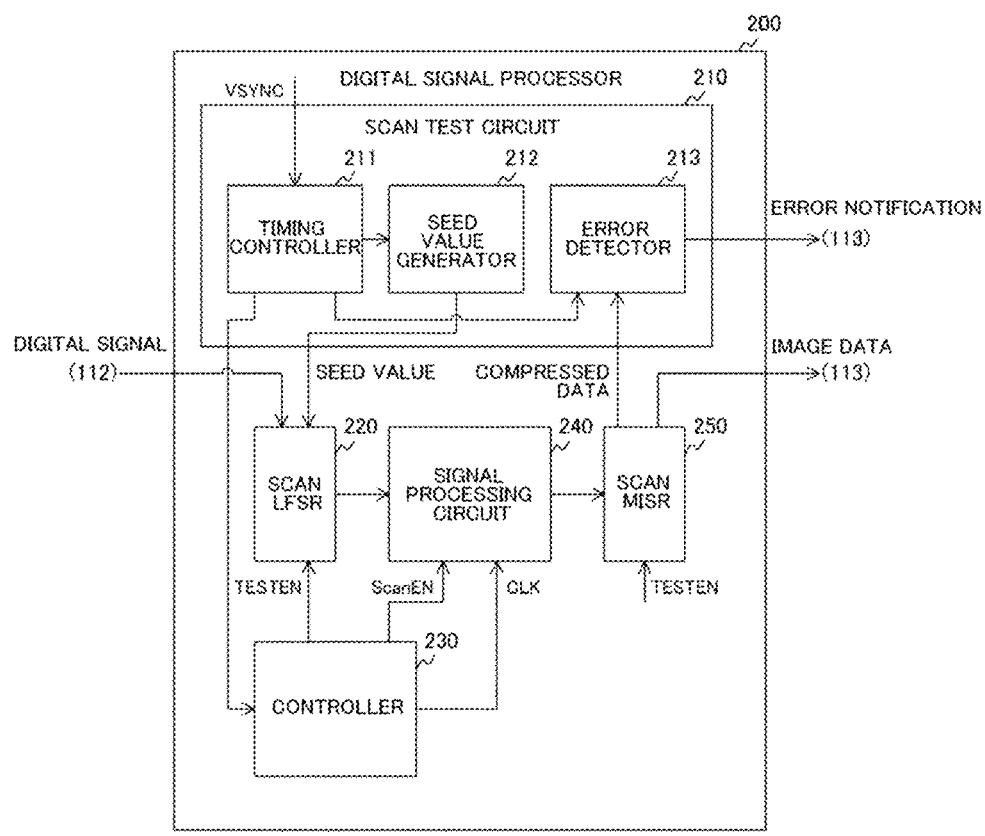
FIG. 3 is a block diagram showing a configuration example of a digital signal processor according to the first embodiment of the present technology.

FIG. 3 is a block diagram showing a configuration example of the digital signal processor 200 according to the first embodiment of the present technology. This digital signal processor 200 includes a scan test circuit 210, a scan LFSR 220, a controller 230, a signal processing circuit 240 and a scan MISR 250.

The scan test circuit 210 performs a scan test on the signal processing circuit 240 during the vertical blanking period. This scan test circuit 210 includes a timing controller 211, a seed value generator 212 and an error detector 213.

The timing controller 211 controls the start timing of the scan test. The timing controller 211 drives the seed value generator 212, the error detector 213 and the controller 230 based on the vertical synchronization signal VSYNC within the vertical blanking period within the period of the vertical synchronization signal.

The seed value generator 212 generates a predetermined seed value for the scan LFSR 220 to generate test patterns. The seed value generator 212 supplies the generated seed value to the scan LFSR 220.

The error detector 213 detects the presence/absence of a fault in the signal processing circuit 240. The error detector 213 receives compressed data obtained by compressing the scan test results from the scan MISR 250. Then, the error detector 213 compares the compressed data with a predetermined expected value, and detects the presence/absence of a fault in the signal processing circuit 240 based on the comparison result. The error detector 213 generates an error notification indicating the detection result and supplies the same to the output interface 113.

The controller 230 controls the scan LFSR 220, the signal processing circuit 240 and the scan MISR 250. This controller 230 generates a predetermined clock signal CLK having a higher frequency than the vertical synchronization signal VSYNC and supplies the same to the signal processing circuit 240.

The controller 230 also generates a test enable signal TESTEN under the control of the timing controller 211 and supplies the same to the scan LFSR 220 and the scan MISR 250. The test enable signal TESTEN is a signal indicating whether or not the scan test is being executed, is set to disabled during the video period, and set to enabled during the vertical blanking period.

The controller 230 also generates a scan enable signal ScanEN and inputs the same to the signal processing circuit 240. The scan enable signal ScanEN is a signal for switching the input destination of a scan flip-flop in the signal processing circuit 240.

The scan LFSR 220 generates a test pattern by LFSR based on the seed value. A digital signal from the analog-to-digital converter 112, a seed value from the seed value generator 212, and a test enable signal TESTEN from the controller 230 are input to the scan LFSR 220. The scan LFSR 220 is an example of a test pattern generation circuit described in the claims.

When the test enable signal TESTEN is disabled, the scan LFSR 220 supplies the digital signal from the analog-to-digital converter 112 as it is to the signal processing circuit 240. On the other hand, when the test enable signal TESTEN is enabled, the scan LFSR 220 generates a predetermined test pattern from the seed value and supplies the same to the signal processing circuit 240.

The signal processing circuit 240 includes a combinational circuit including a predetermined number of flip-flops and a predetermined number of logic gates. The signal processing circuit 240 executes signal processing in synchronization with the clock signal CLK, and supplies image data in which the processed digital signals are arranged to the scan MISR 250.

When the scan enable signal ScanEN is enabled, the flip-flops in the signal processing circuit 240 are connected in series and fetch the test pattern in synchronization with the clock signal CLK. Then, the combinational circuit in the signal processing circuit 240 executes logic operations on the test pattern, and the flip-flops fetch the operation result. The flip-flops supply data including operation results to the scan MISR 250 as test results in synchronization with the clock signal CLK.

The scan MISR 250 compresses the test results by MISR. When the test enable signal TESTEN is disabled, the scan MISR 250 outputs the image data from the signal processing circuit 240 to the output interface 113 as it is.

On the other hand, when the test enable signal TESTEN is enabled, the scan MISR 250 generates compressed data by compressing the test result from the signal processing circuit 240 by MISR, and supplies the compressed data to the error detector 213.

Figure 4A:
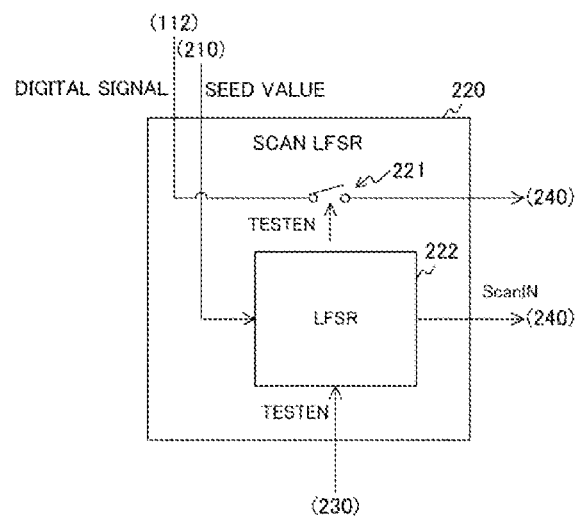
FIGS. 4A and 4B are block diagrams showing a configuration example of a scan LFSR (Linear Feedback Shift Register) and a scan MISR (Multiple Input Signature Register) according to the first embodiment of the present technology.
Figure 4B:
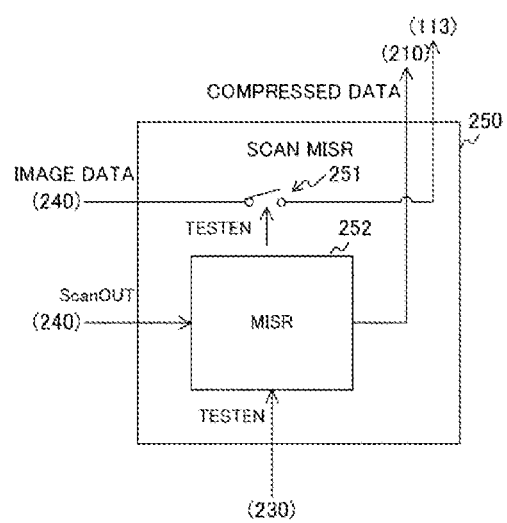

FIGS. 4A and 4B are block diagrams showing a configuration example of the scan LFSR 220 and the scan MISR 250 according to the first embodiment of the present technology. FIG. 4A is a block diagram showing a configuration example of the scan LFSR 220. FIG. 4B is a block diagram showing a configuration example of the scan MISR 250.

The scan LFSR 220 includes a switch 221 and an LFSR 222, as shown in FIG. 4A. The switch 221 supplies the digital signal from the analog-to-digital converter 112 to the signal processing circuit 240 when the test enable signal TESTEN is disabled.

The LFSR 222 generates a test pattern ScanIN based on the seed value from the scan test circuit 210 and supplies the same to the signal processing circuit 240 when the test enable signal TESTEN is enabled.

The scan MISR 250 includes a switch 251 and an MISR 252 as shown in FIG. 4B. The switch 251 supplies the image data from the signal processing circuit 240 to the output interface 113 when the test enable signal TESTEN is disabled.

The MISR 252 compresses the test result ScanOUT from the signal processing circuit 240 to generate compressed data and supplies the same to the scan test circuit 210 when the test enable signal TESTEN is enabled.

[Configuration Example of Signal Processing Circuit]

Figure 5:
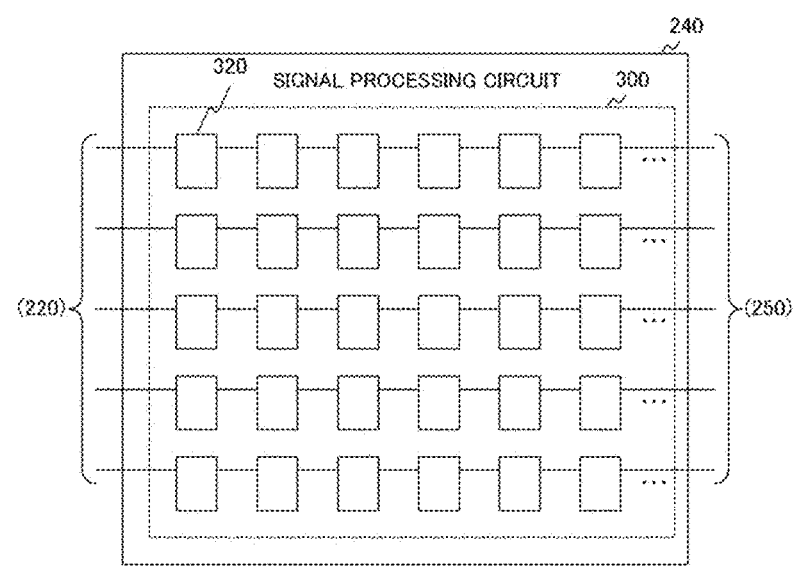
FIG. 5 is a block diagram showing a configuration example of a signal processing circuit according to the first embodiment of the present technology.

FIG. 5 is a block diagram showing a configuration example of the signal processing circuit 240 according to the first embodiment of the present technology. This signal processing circuit 240 includes a processing unit 300. The processing unit 300 processes the digital signal or test pattern ScanIN from the LFSR 222 and supplies the processing result to the scan MISR 250. A predetermined number of scan flip-flops such as the scan flip-flops 320 are arranged in the processing unit 300.

Figure 6:
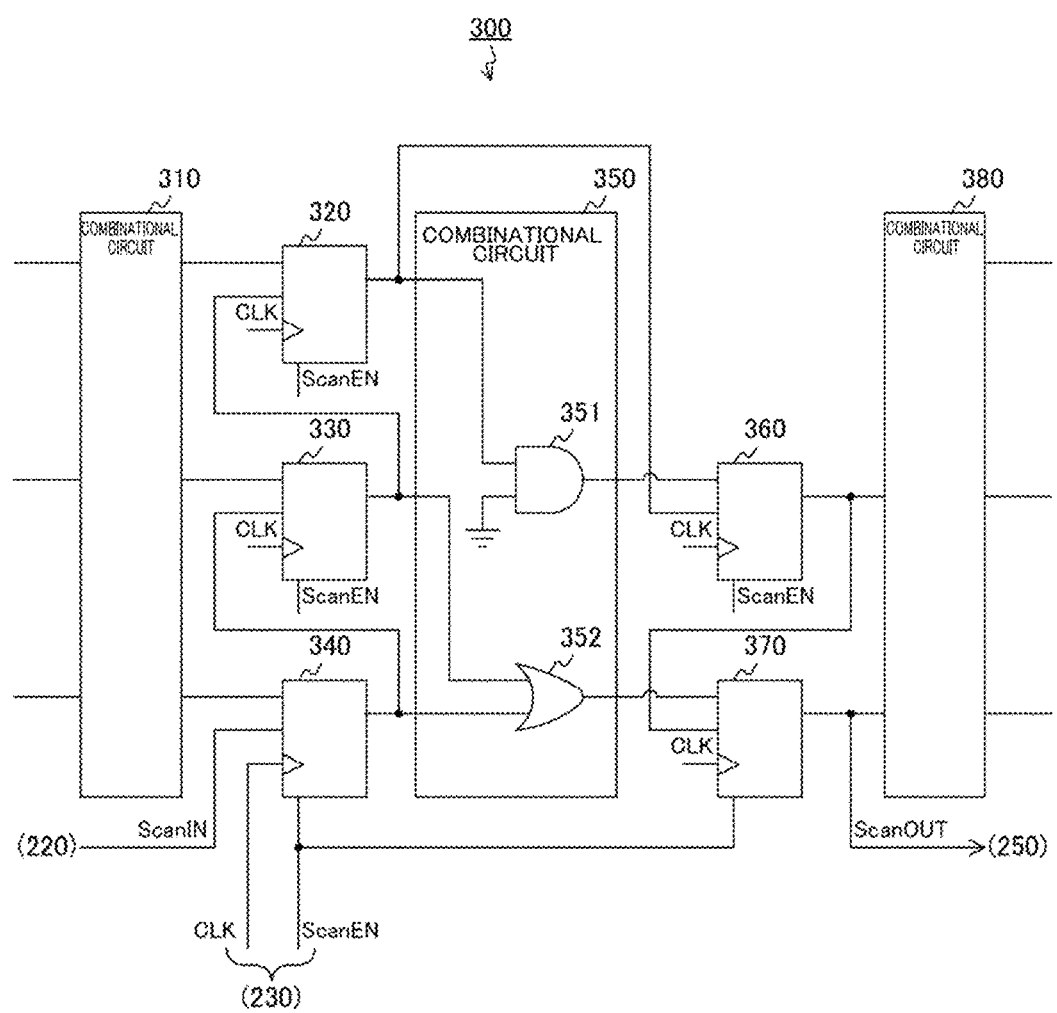
FIG. 6 is a circuit diagram showing a configuration example of a processing unit according to the first embodiment of the present technology.

FIG. 6 is a circuit diagram showing a configuration example of the processing unit 300 according to the first embodiment of the present technology. In this processing unit 300, a predetermined number of combinational circuits such as combinational circuits 310, 350 and 380 and a predetermined number of scan flip-flops such as the scan flip-flops 320, 330, 340, 360 and 370 are arranged.

The combinational circuit 310 performs a predetermined logic operation on the input digital signal. The combinational circuit 310 is provided with a predetermined number of logic gates such as AND (logical product) gates and OR (logical sum) gates. The combinational circuit 310 provides the processed digital signal to the scan flip-flops 320, 330 and 340.

The scan flip-flop 340 fetches either the digital signal from the combinational circuit 310 or the test pattern ScanIN from the scan LFSR 220 in synchronization with the clock signal CLK.

When the scan enable signal ScanEN is disabled, the scan flip-flop 340 fetches the digital signal from the combinational circuit 310. On the other hand, when the scan enable signal ScanEN is enabled, the scan flip-flop 340 fetches the test pattern ScanIN from the scan LFSR 220. The scan flip-flop 340 then outputs the fetched data to the scan flip-flop 330 and the combinational circuit 350 in synchronization with the clock signal CLK.

The scan flip-flop 330 fetches either the digital signal from the combinational circuit 310 or the test pattern ScanIN from the scan flip-flop 340 in synchronization with the clock signal CLK. The scan flip-flop 330 outputs the fetched data to the scan flip-flop 320 and the combinational circuit 350 in synchronization with the clock signal CLK.

The scan flip-flop 320 fetches either the digital signal from the combinational circuit 310 or the test pattern ScanIN from the scan flip-flop 330 in synchronization with the clock signal CLK. The scan flip-flop 320 outputs the fetched data to the scan flip-flop 360 and the combinational circuit 350 in synchronization with the clock signal CLK.

The combinational circuit 350 performs a predetermined logic operation on the input digital signal. The combinational circuit 350 is provided with a predetermined number of logic gates such as an AND gate 351 and an OR gate 352.

The AND gate 351 performs a logical product operation of the signal from the scan flip-flop 320 and a signal having a logical value of "0", and supplies the result to the scan flip-flop 360. The OR gate 352 performs a logical sum operation of the signal from the scan flip-flop 330 and the signal from the scan flip-flop 340 and supplies the result to the scan flip-flop 370.

The scan flip-flop 360 fetches either the signal from the combinational circuit 350 or the test pattern ScanIN from the scan flip-flop 320 in synchronization with the clock signal CLK. The scan flip-flop 360 outputs the fetched data to the scan flip-flop 370 and the combinational circuit 380 in synchronization with the clock signal CLK.

The scan flip-flop 370 fetches either the signal from the combinational circuit 350 or the test pattern ScanIN from the scan flip-flop 360 in synchronization with the clock signal CLK. The scan flip-flop 370 outputs the fetched data to combinational circuit 380 and the scan MISR 250 in synchronization with the clock signal CLK. Data from the scan flip-flop 370 is output to the scan MISR 250 as a test result ScanOUT.

The combinational circuit 380 performs a predetermined logic operation on the input digital signal. This combinational circuit 380 supplies the operation result to the subsequent circuit. The operation result of the subsequent circuit is output to the scan MISR 250 as image data.

Although five scan flip-flops are arranged in the figure, the number of scan flip-flops is not limited to five.

[Configuration Example of Scan Flip-Flop]

Figure 7:
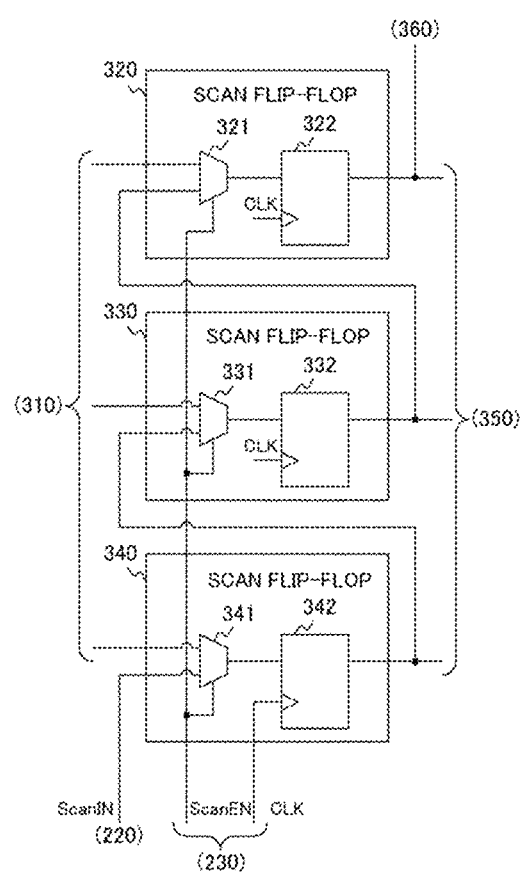
FIG. 7 is a circuit diagram showing a configuration example of a scan flip-flop according to the first embodiment of the present technology.

FIG. 7 is a circuit diagram showing a configuration example of the scan flip-flops 320, 330 and 340 according to the first embodiment of the present technology. The scan flip-flop 320 has a selector 321 and a flip-flop 322. The scan flip-flop 330 has a selector 331 and a flip-flop 332, and the scan flip-flop 340 has a selector 341 and a flip-flop 342.

The selector 341 selects either the digital signal from the combinational circuit 310 or the test pattern ScanIN according to the scan enable signal ScanEN, and supplies the same to the flip-flop 342.

The flip-flop 342 fetches the data from the selector 341 in synchronization with the clock signal CLK. The flip-flop 342 outputs the fetched data to the scan flip-flop 330 and the combinational circuit 350 in synchronization with the clock signal CLK.

The circuit configuration of each of the scan flip-flops 320, 330, 360 and 370 is similar to that of the scan flip-flop 340.

As shown in FIGS. 6 and 7, when the scan enable signal ScanEN is enabled, a predetermined number of scan flip-flops such as the scan flip-flops 320 are connected in series to form a shift register. This shift register fetches and holds the test pattern ScanIN in synchronization with the clock signal CLK. When the number of scan flip-flops is N (N is an integer), an N-bit test pattern ScanIN is input. The N-bit test pattern ScanIN is fetched bit by bit, and N clocks are required to fetch all the bits. Thus, the control of connecting a predetermined number of scan flip-flops in series, inputting a test pattern, and detecting the presence/absence of a fault in a combinational circuit is called a scan test.

In the scan test, the circuits subsequent to the scan flip-flops (such as the combinational circuit 350) are the test targets of the scan test. The preceding flip-flops such as the scan flip-flops 320, 330 and 340 input part of the test pattern ScanIN to the combinational circuit 350 under test. The combinational circuit 350 performs a logic operation on the input data and outputs the result to preceding flip-flops such as the scan flip-flops 360 and 370. The flip-flops behind them fetch the operation results. Data consisting of the operation results held in the subsequent scan flip-flops 360 and 370 and the data held in the preceding scan flip-flops 320, 330 and 340 are output as the test result ScanOUT at N clocks.

Figure 8:
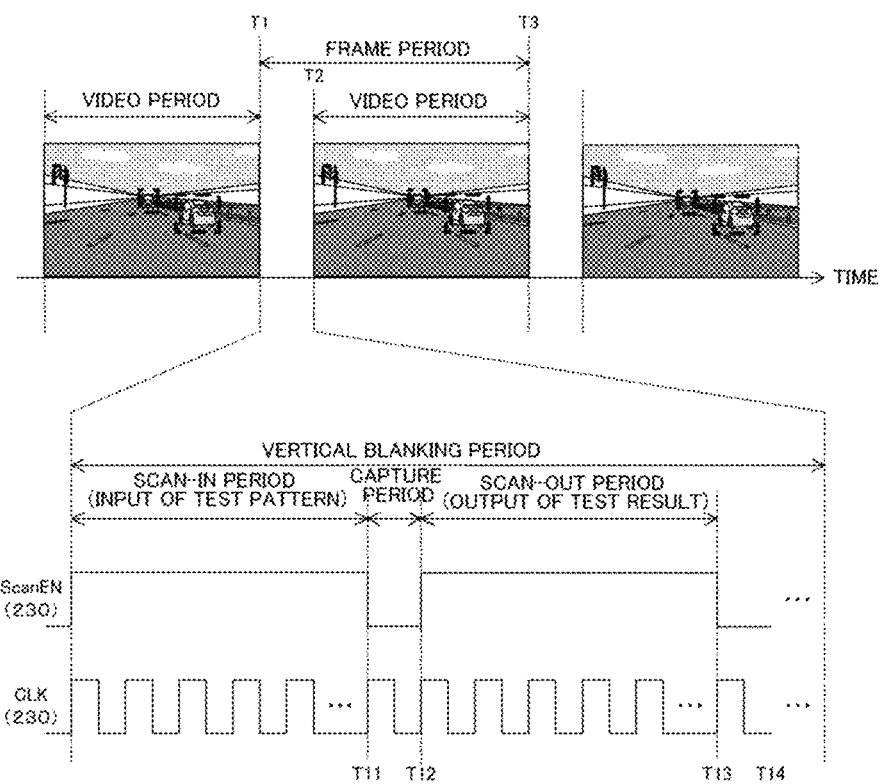
FIG. 8 is a timing chart showing an example of the operation of the solid-state imaging device according to the first embodiment of the present technology.

FIG. 8 is a timing chart showing an example of the operation of the solid-state imaging device 110 according to the first embodiment of the present technology. A period from the rising (or falling) of the vertical synchronization signal to the next rising (or falling) is defined as a frame period.

A frame period includes a vertical blanking period and other video periods. For example, within the frame period of timings T1 to T3, the period of timings T1 to T2 is set as the vertical blanking period. The period of timings T2 to timing T3 is set as the video period. The length of the vertical blanking period shall be shorter than the video period.

During the video period, the solid-state imaging device 110 captures image data. On the other hand, the solid-state imaging device 110 performs a scan test during the vertical blanking period. The test enable signal TESTEN is disabled during the video period and enabled during the vertical blanking period.

The vertical blanking period includes a scan-in period, a capture period, and a scan-out period. For example, the scan-in period is set from timing T1 to T11. When the number of scan flip-flops is N, the length of this scan-in period is set to N times the period of the clock signal CLK (that is, N clocks). The capture period is set from timing T11 to T12. The length of the capture period is set to one clock of the clock signal CLK. The period of timings T12 to T13 is set as the scan-out period. The length of the scan-out period is set to be the same as the scan-in period.

During the scan-in period, the controller 230 enables the scan enable signal ScanEN, and the scan LFSR 220 inputs the test pattern ScanIN. When enabling, for example, a high-level scan enable signal ScanEN is supplied. On the other hand, when disabling, for example, a low-level scan enable signal ScanEN is supplied.

During the capture period, the controller 230 disables the scan enable signal ScanEN and causes the scan flip-flops 360 and 370 in the subsequent stage to fetch the operation results.

During the scan-out period, the controller 230 enables the scan enable signal ScanEN, and the scan flip-flop outputs the test result ScanOUT.

The procedure from scan-in to scan-out described above is not limited to one time, and can be executed multiple times by changing the test pattern as necessary.

As shown in the figure, the solid-state imaging device 110 can detect the presence/absence of a circuit fault during moving image imaging by performing a scan test during the vertical blanking period. In this way, the safety and reliability of the vehicle control system can be improved.

Here, as a comparative example, a solid-state imaging device in which two circuits, a path for processing pixel data and a path for processing test data having the same value as the pixel data, are provided, and the results from the respective paths are compared to detect the presence/absence of circuit faults will be considered. In this comparative example, it is necessary to drive both the path for processing pixel data and the path for processing test data within the video period.

In contrast, in a configuration in which a scan test is performed within a vertical blanking period, a predetermined test pattern is used during a vertical blanking period during which actual data is not generated, instead of testing with actual data (pixel data and test data). Therefore, when performing a scan test, a single pass for processing the test pattern is sufficient. Therefore, there is no need to provide two paths, and it is not necessary to drive those paths during the video period. Therefore, the circuit scale and power consumption can be reduced as compared to the comparative example.

Note that when performing a scan test, unlike the comparative example, it is necessary to drive the digital signal processor 200 within the vertical blanking period. However, since the vertical blanking period is shorter than the video period, the total power consumption in the frame period is smaller than in the comparative example.

Figure 9:
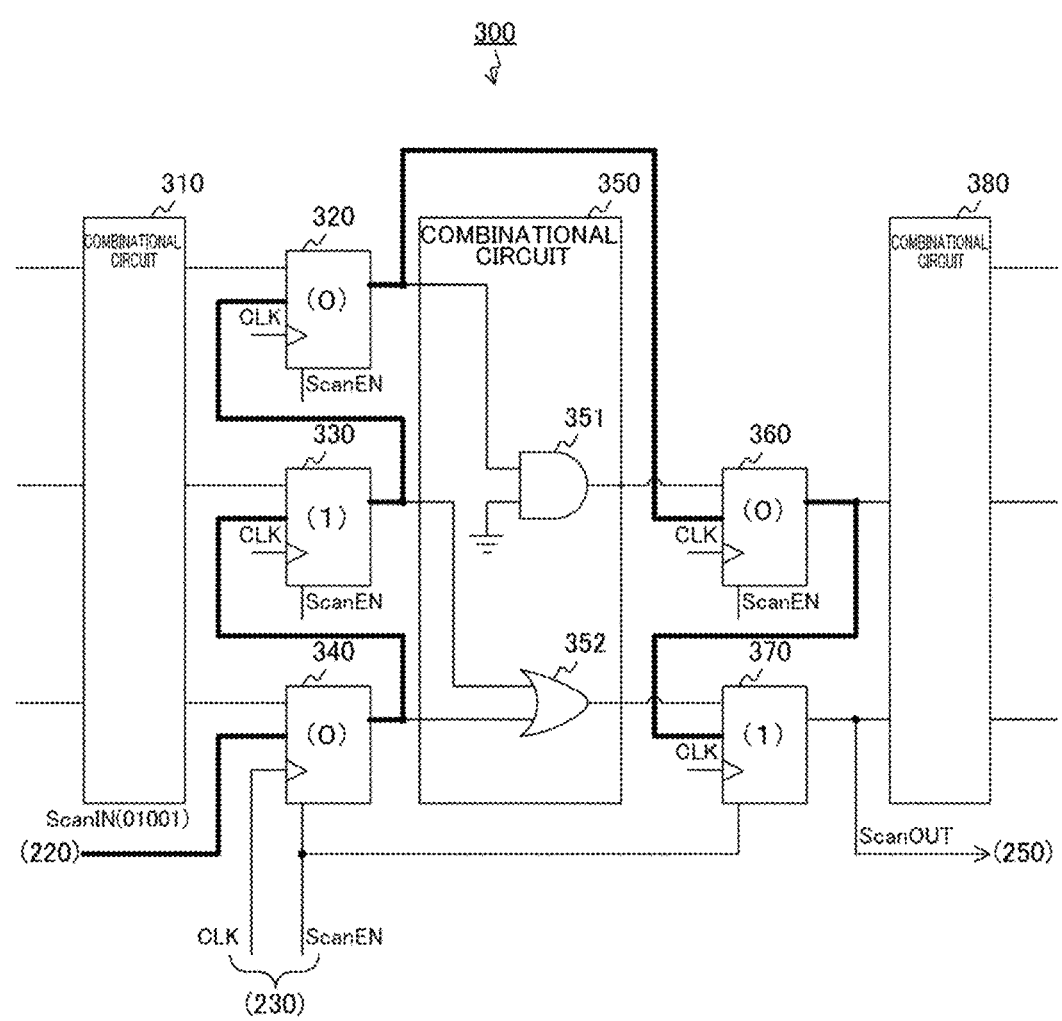
FIG. 9 is a diagram showing an example of a state of a processing unit during a scan-in period according to the first embodiment of the present technology.

FIG. 9 is a diagram showing an example of the state of the processing unit 300 during the scan-in period according to the first embodiment of the present technology. As shown in the figure, the scan flip-flops 320, 330, 340, 360 and 370 are connected in series to form a shift register. This shift register fetches the test pattern ScanIN bit by bit in synchronization with the clock signal CLK.

When there are five scan flip-flops, for example, 5 bits of "01001" are input as the test pattern ScanIN. The scan flip-flops 320, 330, 340, 360 and 370 fetch data of logical values "0", "1", "0", "0" and "1", respectively.

Figure 10:
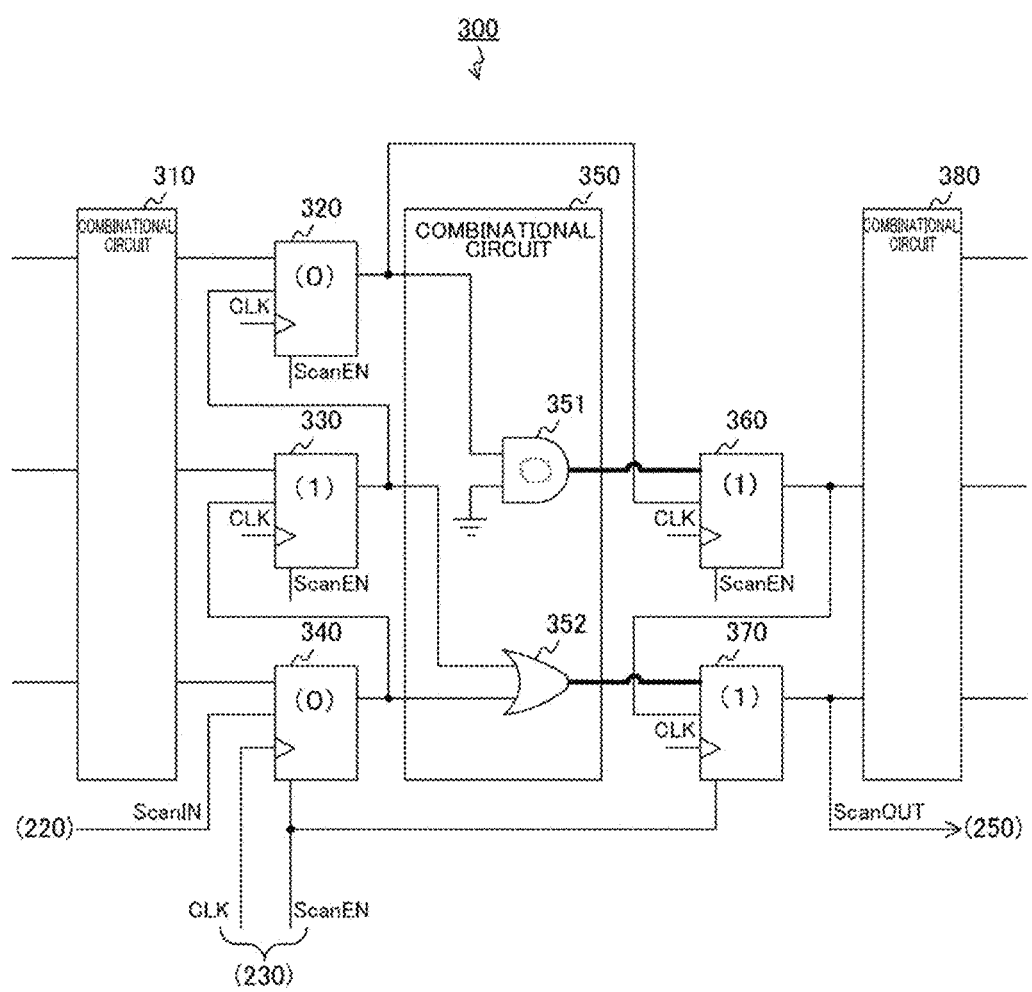
FIG. 10 is a diagram showing an example of a state of a processing unit within a capture period according to the first embodiment of the present technology.

FIG. 10 is a diagram showing an example of the state of the processing unit 300 during the capture period according to the first embodiment of the present technology. The AND gate 351 in the combinational circuit 350 performs a logical product operation between the logical value "0" from the scan flip-flop 320 and a predetermined logical value "0". The OR gate 352 performs a logical sums operation between the logical values "1" and "0" from the scan flip-flops 330 and 340. The scan flip-flops 360 and 370 fetch their operation results during the capture period.

Here, when a fault occurs in the AND gate 351, the logical value "1" different from the expected value is fetched to the scan flip-flop 360 as the operation result of the AND gate 351. If the OR gate 352 is not faulty, the scan flip-flop 370 will fetch the logical value "1", which is the same as the expected value.

Therefore, the scan test circuit 210 can detect the presence/absence of a fault in each of the AND gate 351 and the OR gate 352 by comparing the data held in the scan flip-flops 360 and 370 with expected values.

FIG. 11 is a diagram showing an example of test results, compressed data, expected values, and error notification according to the first embodiment of the present technology. The scan flip-flop outputs data including, for example, "01011" as the test result ScanOUT. The scan MISR 250 removes unnecessary bits from the test result ScanOUT by compression. The scan MISR 250 generates, for example, data including "11" with the leading 3 bits removed as compressed data.

Assume that the expected value of the compressed data output when there is no fault in the signal processing circuit includes, for example, "01". The scan test circuit 210 compares the compressed data with the expected value and identifies the location of the fault based on the comparison result. In the example shown in the figure, since only the first bit of the compressed data differs from the expected value, the scan test circuit 210 determines that the AND gate 351 corresponding to the first bit is faulty and the OR gate 352 corresponding to the second bit is not faulty. The scan test circuit 210 generates and outputs an error notification indicating the determination result.

Figure 12:
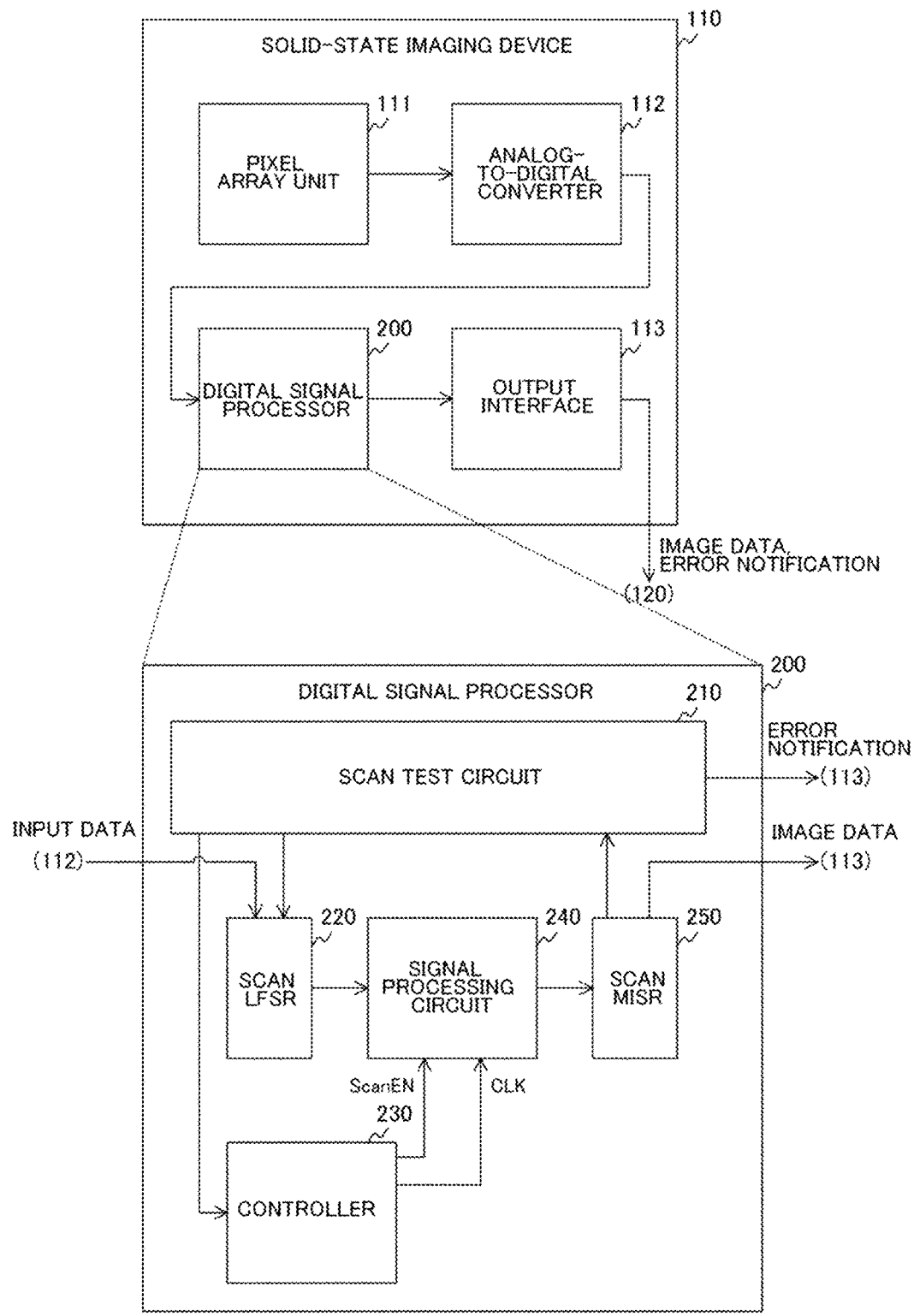
FIG. 12 is a diagram for explaining the scan test procedure in the first embodiment of the present technology.

FIG. 12 is a diagram for explaining the scan test procedure in the first embodiment of the present technology. The pixel array unit 111 generates pixel signals during the video period, and the analog-to-digital converter 112 performs AD conversion on the pixel signals to generate digital signals.

The signal processing circuit 240 in the digital signal processor 200 performs predetermined signal processing on the digital signal from the analog-to-digital converter 112 during the video period. The scan test circuit 210 performs a scan test on the signal processing circuit 240 during a vertical blanking period that does not correspond to the video period.

[Operation Example of Solid-State Imaging Device]

Figure 13:
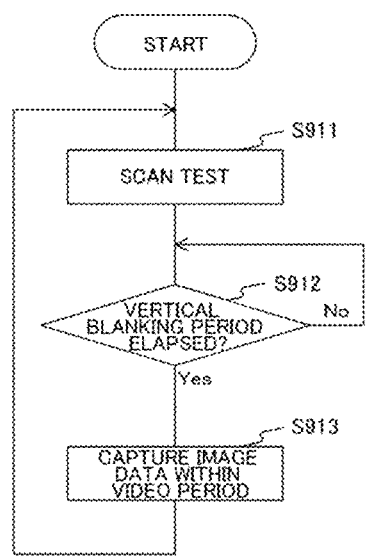
FIG. 13 is a flowchart showing an example of the operation of the solid-state imaging device according to the first embodiment of the present technology.

FIG. 13 is a flowchart showing an example of the operation of the solid-state imaging device 110 according to the first embodiment of the present technology. This operation starts, for example, when a predetermined application for capturing image data is executed.

The scan test circuit 210 in the solid-state imaging device 110 performs a scan test (step S911). The solid-state imaging device 110 determines whether or not the vertical blanking period has elapsed (step S912). If the vertical blanking period has not elapsed (step S912: No), the solid-state imaging device 110 repeats step S912.

On the other hand, if the vertical blanking period has elapsed (step S912: Yes), the solid-state imaging device 110 captures image data within the video period (step S913), and repeats step S911 and subsequent steps.

As described above, according to the first embodiment of the present technology, since the scan test circuit 210 performs the scan test within the vertical blanking period, the power consumption can be reduced as compared to the case of driving two paths during the video period and detecting the presence/absence of faults.

2. Second Embodiment

In the first embodiment described above, the scan test circuit 210 outputs an error notification every frame period. However, with this configuration, the scan test cannot be performed for all of the required patterns, and there is a risk that the fault detection rate will decrease. The solid-state imaging device 110 of the second embodiment differs from that of the first embodiment in that the test pattern is changed every frame period.

Figure 14:
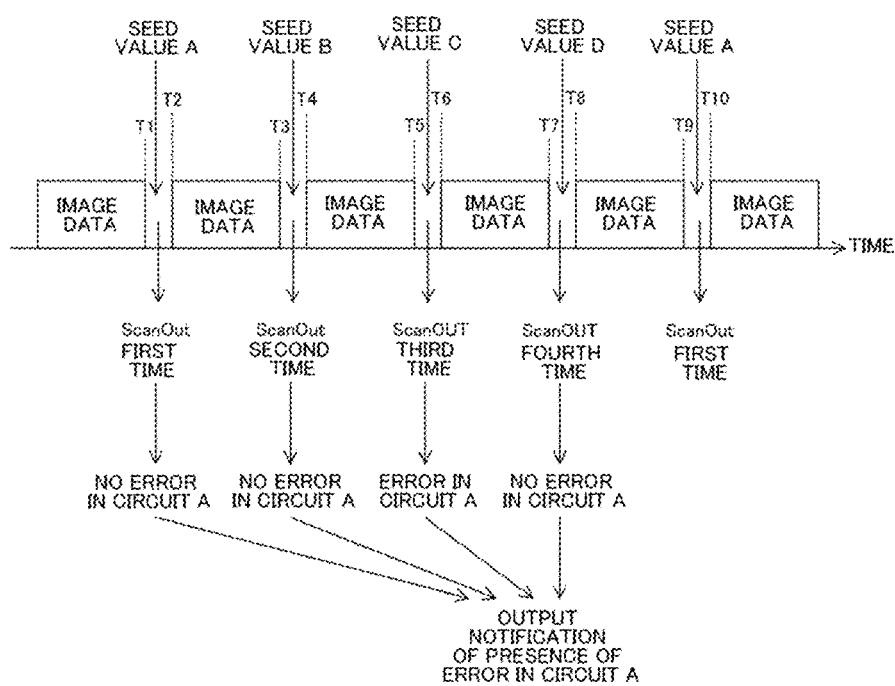
FIG. 14 is a timing chart showing an example of the operation of a solid-state imaging device according to a second embodiment of the present technology.

FIG. 14 is a timing chart showing an example of the operation of the solid-state imaging device 110 according to the second embodiment of the present technology. The scan test circuit 210 in the solid-state imaging device 110 of the second embodiment keeps the seed value constant during the vertical blanking period and changes the seed value each time the frame period elapses. The scan LFSR 220 changes the test pattern ScanIN every frame period based on the seed value.

In general, the greater the number of types of test patterns, the better the fault detection rate. The scan LFSR 220 generates a number of test patterns that provide a fault detection rate equal to or higher than a predetermined value required in the vehicle control system. For example, using one type of test pattern results in a fault detection rate of 70%, and using two, three, and four types of test patterns improves the fault detection rate to 80%, 87%, and 90%, respectively. Here, when a fault detection rate of 90% or more is required, four types of test patterns are used.

The scan test circuit 210 performs a scan test every frame period during which a required number (for example, four) of test patterns are generated in order, and outputs an error notification based on the test results.

For example, the scan test circuit 210 inputs the seed value A during the first vertical blanking period of timings T1 to T2. The scan test circuit 210 compares the first test result ScanOUT with the expected value, and holds the comparison result. No error notification is output at this point.

During the second vertical blanking period of timings T3 to T4, the scan test circuit 210 changes the seed value to B and changes the test pattern. The scan test circuit 210 compares the second test result ScanOUT with the expected value, and holds the comparison result. No error notification is output at this point.

During the third vertical blanking period of timings T5 to T6, the scan test circuit 210 changes the seed value to C and changes the test pattern. The scan test circuit 210 compares the third test result ScanOUT with the expected value, and holds the comparison result. No error notification is output at this point.

The scan test circuit 210 changes the seed value to D and changes the test pattern during the fourth vertical blanking period of timings T7 to T8. The scan test circuit 210 compares the fourth test result ScanOUT with the expected value. Then, the scan test circuit 210 detects the presence/absence of a fault based on each of the first to fourth comparison results, and generates an error notification. For example, if one or more of the four comparison results for a certain circuit A indicate that the circuit is faulty, the scan test circuit 210 determines that the circuit A is faulty. On the other hand, if all the four comparison results indicate that there is no fault, the scan test circuit 210 determines that circuit A has no fault.

During the fifth vertical blanking period of timings T9 to T10, the scan test circuit 210 restores the seed value to the initial value. After that, the same procedure is repeated and executed every four frames.

By changing the test pattern every frame period as described above, the scan test circuit 210 can perform a scan test using a plurality of test patterns and improve the fault detection rate.

As described above, according to the second embodiment of the present technology, since the scan test circuit 210 changes the test pattern every frame period, the scan test can be performed using a plurality of test patterns. As a result, the fault detection rate can be improved as compared to the first embodiment in which the test pattern is not changed.

3. Third Embodiment

In the first embodiment described above, the scan test circuit 210 inputs an N-bit test pattern to N scan flip-flops. However, with this configuration, the more the number of scan flip-flops, the longer the time required for the scan test. The solid-state imaging device 110 of the third embodiment differs from the first embodiment in that the signal processing circuit 240 is divided into a plurality of processing units and scan tests are performed in parallel for the processing units.

Figure 15:
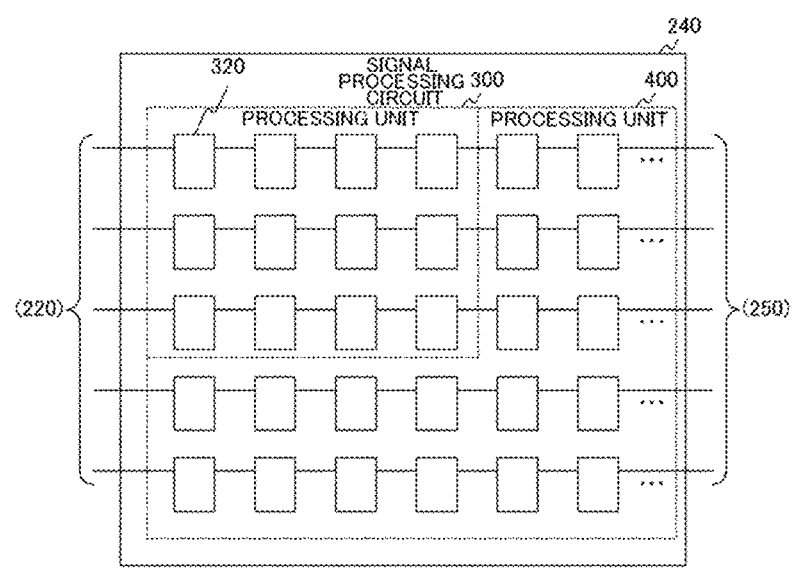
FIG. 15 is a block diagram showing a configuration example of a signal processing circuit according to a third embodiment of the present technology.

FIG. 15 is a block diagram showing a configuration example of the signal processing circuit 240 according to the third embodiment of the present technology. The signal processing circuit 240 of this third embodiment is divided into a processing unit 300 and a processing unit 400. The processing unit 300 is an example of a first processing unit described in the claims, and the processing unit 400 is an example of a second processing unit described in the claims.

Figure 16:
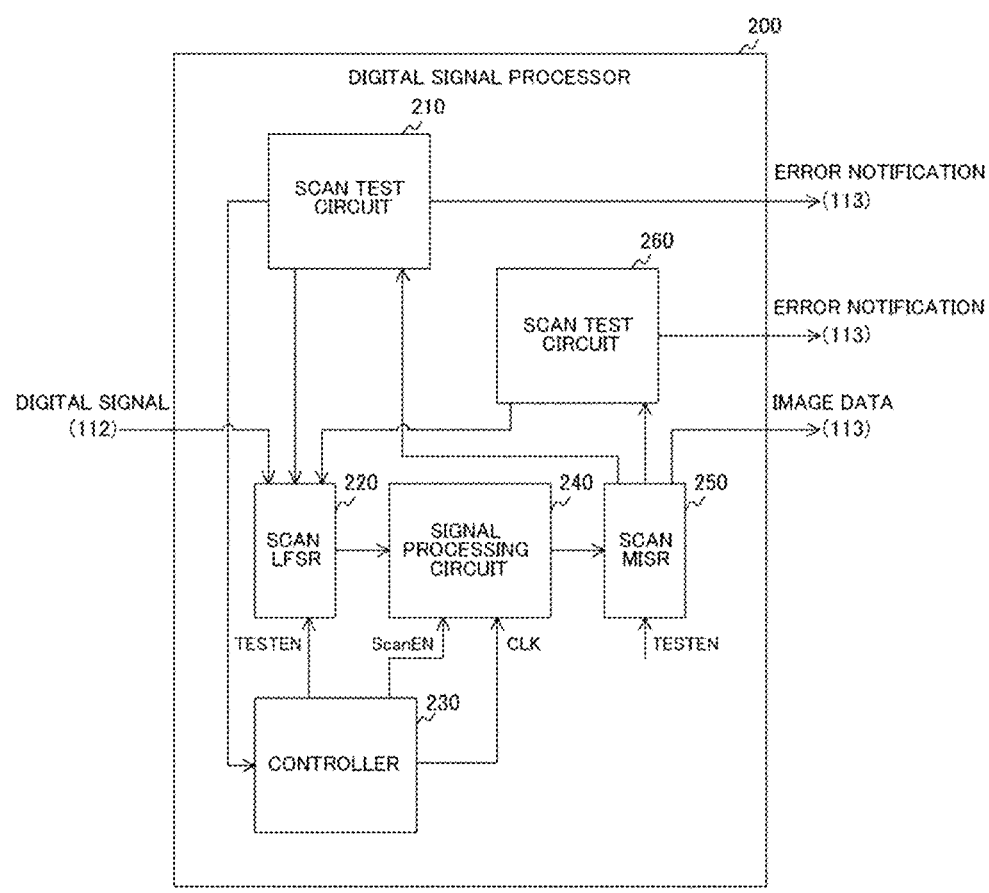
FIG. 16 is a block diagram showing a configuration example of a digital signal processor according to the third embodiment of the present technology.

FIG. 16 is a block diagram showing a configuration example of the digital signal processor 200 according to the third embodiment of the present technology. The digital signal processor 200 of the third embodiment differs from that of the first embodiment in that a scan test circuit 260 is further provided.

The scan test circuit 260 performs a scan test on the processing unit 400 during the vertical blanking period. The scan test circuit 260 detects the presence/absence of a fault in the processing unit 400 and supplies an error notification indicating the detection result to the output interface 113.

The scan test circuit 210 is an example of a first test circuit described in the claims, and the scan test circuit 260 is an example of a second test circuit described in the claims.

Figure 17:
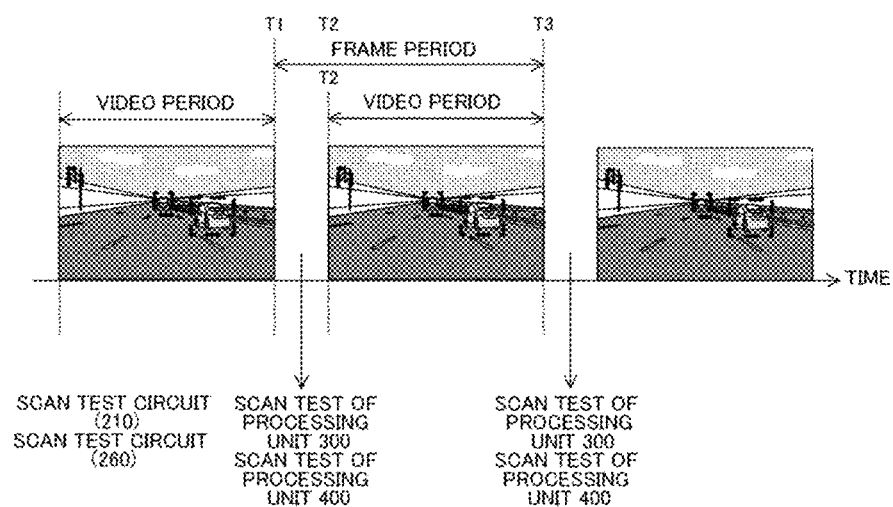
FIG. 17 is a timing chart showing an example of the operation of the solid-state imaging device according to the third embodiment of the present technology.

FIG. 17 is a timing chart showing an example of the operation of the solid-state imaging device 110 according to the third embodiment of the present technology. In each frame period, the scan test circuit 210 performs a scan test on the processing unit 300 within the vertical blanking period, and the scan test circuit 210 performs a scan test on the processing unit 400. By performing the scan test in parallel on the plurality of processing units in this manner, the time required for the scan test can be shortened.

For example, when N scan flip-flops are arranged in the signal processing circuit 240, by dividing the signal processing circuit 240 into the processing unit 300 and the processing unit 400, the number of scan flip-flops in each processing unit can be reduced to less than N. As a result, the scan-in and scan-out periods can be shortened compared to the case of not dividing the circuit.

Although the signal processing circuit 240 is divided into two processing units, it can be divided into three or more. In this case, three or more scan test circuits are arranged.

The second embodiment can be applied to the third embodiment.

As described above, according to the third embodiment of the present technology, since the scan test circuit 210 performs a scan test on the processing unit 300 and the scan test circuit 260 performs a scan test on the processing unit 400, a scan test can be performed on a plurality of processing units in parallel. In this way, the time required for the scan test can be shortened.

4. Fourth Embodiment

In the first embodiment described above, the scan test circuit 210 detects the presence/absence of a fault in the signal processing circuit 240. If the scan test circuit 210 is faulty, the fault detection rate of the signal processing circuit 240 may decrease. The solid-state imaging device 110 of the fourth embodiment differs from that of the first embodiment in that it further detects the presence/absence of a fault in the scan test circuit 210.

Figure 18:
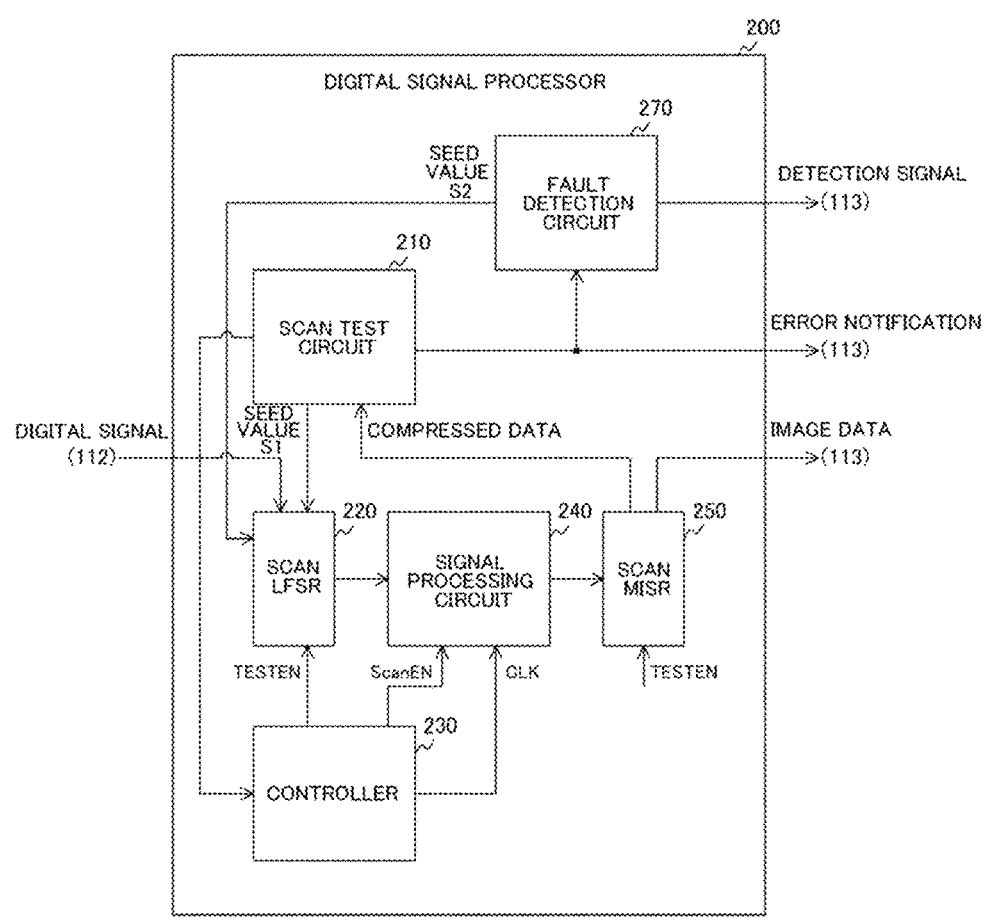
FIG. 18 is a block diagram showing a configuration example of a digital signal processor according to a fourth embodiment of the present technology.

FIG. 18 is a block diagram showing a configuration example of the digital signal processor 200 according to the fourth embodiment of the present technology. This digital signal processor 200 differs from the first embodiment in that it further includes a fault detection circuit 270.

The fault detection circuit 270 detects the presence/absence of a fault in the scan test circuit 210. It is assumed that the detection of the presence/absence of a fault in the scan test circuit 210 is not executed every frame, but is executed every M (M is an integer of 2 or more) frames. The fault detection circuit 270 generates a seed value S2 and supplies the same to the scan LFSR 220 at the timing of detecting a fault. Here, the seed value S2 is different from the seed value S1 generated by the scan test circuit 210, and when a scan test is performed using this seed value S2, a test result different from the expected value is obtained even if there is no fault in the signal processing circuit 240.

The scan LFSR 220 of the fourth embodiment generates a test pattern from the seed value S2 instead of the seed value S1 when the seed value S2 is generated.

The scan test circuit 210 of the fourth embodiment also supplies error notification to the fault detection circuit 270. Based on the error notification, the fault detection circuit 270 determines whether or not a fault was detected in the signal processing circuit 240 when the seed value S2 was supplied.

When a fault is detected in the signal processing circuit 240, the fault detection circuit 270 determines that the scan test circuit 210 has no fault. On the other hand, if no fault is detected in the signal processing circuit 240, the fault detection circuit 270 determines that the scan test circuit 210 is faulty. The fault detection circuit 270 generates a detection signal indicating the presence/absence of a fault in the scan test circuit 210 and supplies the same to the output interface 113.

The fault detection circuit 270 can also generate input data for which the expected value cannot be obtained, instead of the seed value S2, and input the same to the signal processing circuit 240.

Figure 19:
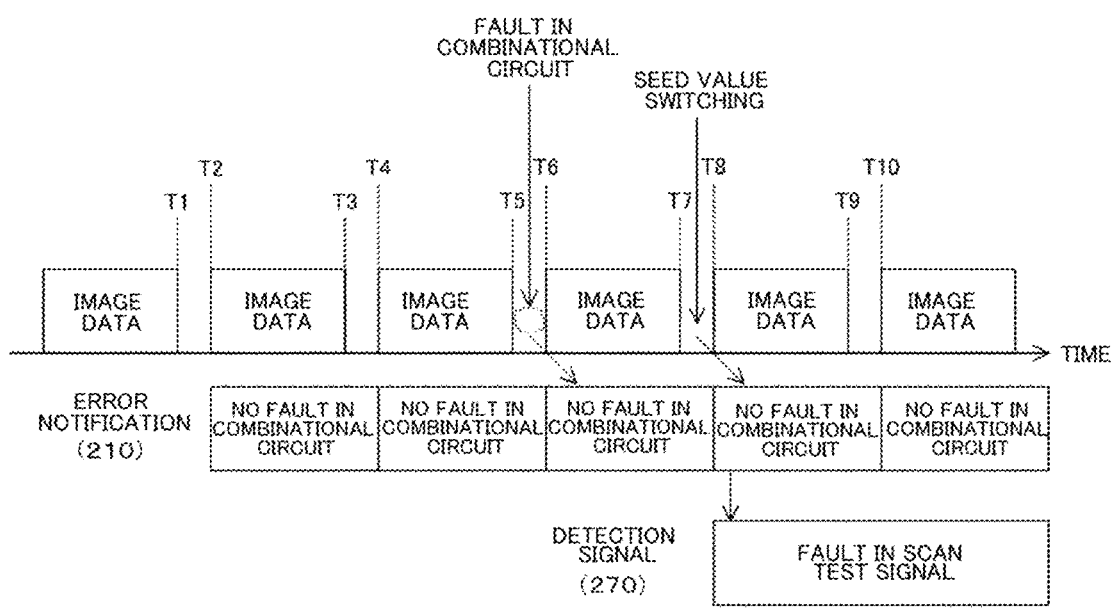
FIG. 19 is a timing chart showing an example of the operation of a solid-state imaging device according to the fourth embodiment of the present technology when a scan test circuit is faulty.

FIG. 19 is a timing chart showing an example of the operation of the solid-state imaging device 110 according to the fourth embodiment of the present technology when the scan test circuit 210 is faulty.

A case where the combinational circuit under test is faulty during the vertical blanking period of timings T5 to T6 will be considered. If the scan test circuit 210 is faulty, fault detection of the combinational circuit fails even though the expected value cannot be obtained in the scan test during this period.

Then, in the next vertical blanking period of timings T7 to T8, the fault detection circuit 270 switches the seed value. Since the scan test circuit 210 is faulty, it is determined that there is no fault in the combinational circuit and an error notification is output even though the expected value cannot be obtained. The fault detection circuit 270 determines that the scan test circuit 210 is faulty based on the error notification.

Figure 20:
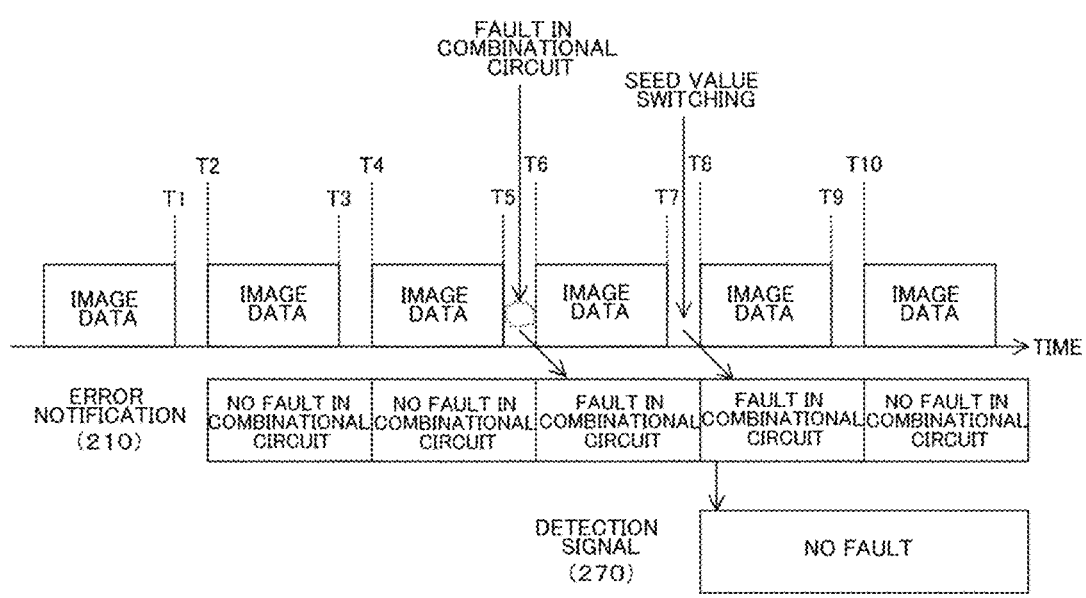
FIG. 20 is a timing chart showing an example of the operation of the solid-state imaging device according to the fourth embodiment of the present technology when the scan test circuit is not faulty.

FIG. 20 is a timing chart showing an example of the operation of the solid-state imaging device 110 according to the fourth embodiment of the present technology when the scan test circuit 210 is not faulty.

A case where the combinational circuit under test is faulty during the vertical blanking period of timings T5 to T6 will be considered. If the scan test circuit 210 is normal, since the expected value cannot be obtained in the scan test during this period, a fault in the combinational circuit is detected.

Then, in the next vertical blanking period of timings T7 to T8, the fault detection circuit 270 switches the seed value. Since the scan test circuit 210 is normal, it is determined again that a fault has occurred in the combinational circuit and an error notification is output. The fault detection circuit 270 determines that the scan test circuit 210 has no fault based on the error notification.

As shown in FIGS. 19 and 20, the fault detection circuit 270 can detect the presence/absence of a fault in the scan test circuit 210 by inputting a seed value for which no expected value can be obtained. In this way, the fault detection rate of the signal processing circuit 240 can be improved.

The second and third embodiments can also be applied to the fourth embodiment.

As described above, according to the fourth embodiment of the present technology, since the fault detection circuit 270 detects the presence/absence of a fault in the scan test circuit 210, the fault detection rate of the signal processing circuit 240 to be subjected to the scan test is further improved.

5. Example of Application to Moving Body

The technology according to the present disclosure (the present technology) can be applied to various products. For example, the technology according to the present disclosure may be realized as a device equipped in any type of moving body such as an automobile, an electric vehicle, a hybrid electric vehicle, a motorcycle, a bicycle, a personal mobility device, an airplane, a drone, a ship, and a robot.

Figure 21:
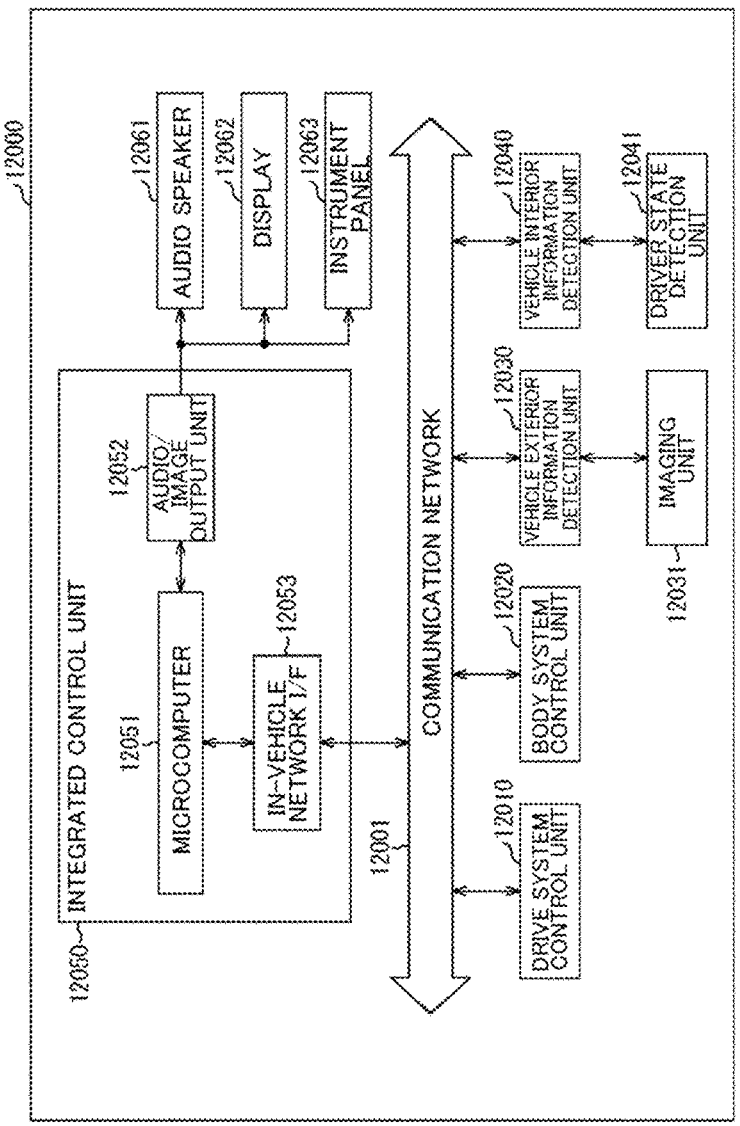
FIG. 21 is a block diagram showing a schematic configuration example of a vehicle control system.

FIG. 21 is a block diagram showing a schematic configuration example of a vehicle control system, which is an example of a moving body control system to which the technique according to the present disclosure can be applied.

The vehicle control system 12000 includes a plurality of electronic control units connected thereto via a communication network 12001. In the example shown in FIG. 21, the vehicle control system 12000 includes a drive system control unit 12010, a body system control unit 12020, a vehicle exterior information detection unit 12030, a vehicle interior information detection unit 12040, and an integrated control unit 12050. Furthermore, as a functional configuration of the integrated control unit 12050, a microcomputer 12051, an audio/image output unit 12052, and an in-vehicle network interface (I/F) 12053 are shown.

The drive system control unit 12010 controls an operation of an apparatus related to a drive system of a vehicle according to various programs. For example, the drive system control unit 12010 functions as a driving force generator for generating a driving force of a vehicle such as an internal combustion engine or a driving motor, a driving force transmission mechanism for transmitting a driving force to wheels, a steering mechanism for adjusting a turning angle of a vehicle, and a control apparatus such as a braking apparatus that generates a braking force of a vehicle.

The body system control unit 12020 controls operations of various devices mounted in the vehicle body according to various programs. For example, the body system control unit 12020 functions as a control device of a keyless entry system, a smart key system, a power window device, or various lamps such as a headlamp, a back lamp, a brake lamp, a turn signal, and a fog lamp. In this case, radio waves transmitted from a portable device that substitutes for a key or signals of various switches may be input to the body system control unit 12020. The body system control unit 12020 receives inputs of the radio waves or signals and controls a door lock device, a power window device, and a lamp of the vehicle.

The vehicle exterior information detection unit 12030 detects information on the outside of the vehicle having the vehicle control system 12000 mounted thereon. For example, an imaging unit 12031 is connected to the vehicle exterior information detection unit 12030. The vehicle exterior information detection unit 12030 causes the imaging unit 12031 to capture an image of the outside of the vehicle and receives the captured image. The vehicle exterior information detection unit 12030 may perform object detection processing or distance detection processing for peoples, cars, obstacles, signs, and letters on the road on the basis of the received image.

The imaging unit 12031 is an optical sensor that receives light and outputs an electrical signal according to the amount of the received light. The imaging unit 12031 can also output the electrical signal as an image or distance measurement information. In addition, the light received by the imaging unit 12031 may be visible light or invisible light such as infrared light.

The vehicle interior information detection unit 12040 detects information on the inside of the vehicle. For example, a driver state detection unit 12041 that detects a driver's state is connected to the vehicle interior information detection unit 12040. The driver state detection unit 12041 includes, for example, a camera that captures an image of a driver, and the vehicle interior information detection unit 12040 may calculate a degree of fatigue or concentration of the driver or may determine whether or not the driver is dozing on the basis of detection information input from the driver state detection unit 12041.

The microcomputer 12051 can calculate a control target value of the driving force generation device, the steering mechanism, or the braking device on the basis of information acquired by the vehicle exterior information detection unit 12030 or the vehicle interior information detection unit 12040 inside and outside the vehicle, and output a control command to the drive system control unit 12010. For example, the microcomputer 12051 can perform cooperative control for the purpose of realizing the functions of an advanced driver assistance system (ADAS) including vehicle collision avoidance or impact mitigation, following travel based on an inter-vehicle distance, vehicle speed maintenance travel, vehicle collision warning, or vehicle lane deviation warning.

The microcomputer 12051 can perform cooperative control for the purpose of automated driving or the like in which autonomous travel is performed without depending on operations of the driver, by controlling the driving force generator, the steering mechanism, or the braking device and the like on the basis of information about the surroundings of the vehicle, the information being acquired by the vehicle exterior information detection unit 12030 or the vehicle interior information detection unit 12040.

In addition, the microcomputer 12051 can output a control command to the body system control unit 12020 based on the information acquired by the vehicle exterior information detection unit 12030 outside the vehicle. For example, the microcomputer 12051 can perform cooperative control for the purpose of preventing glare, such as switching from a high beam to a low beam, by controlling the headlamp according to the position of a preceding vehicle or an oncoming vehicle detected by the vehicle exterior information detection unit 12030.

The audio/image output unit 12052 transmits an output signal of at least one of sound and an image to an output device capable of visually or audibly notifying a passenger or the outside of the vehicle of information. In the example of FIG. 21, an audio speaker 12061, a display 12062, and an instrument panel 12063 are shown as examples of the output device. The display 12062 may include at least one of an on-board display and a head-up display, for example.

Figure 22:
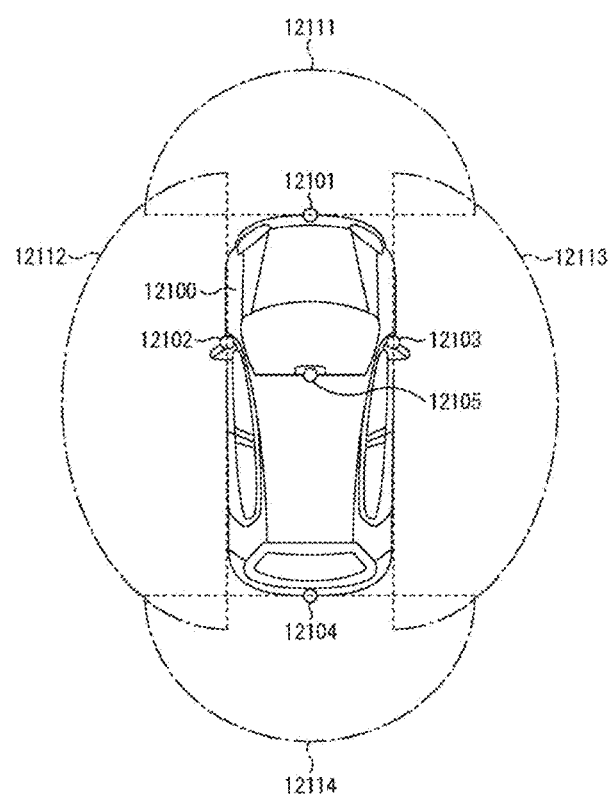
FIG. 22 is a diagram showing an example of an installation position of an imaging unit.

FIG. 22 is a diagram showing an example of an installation position of the imaging unit 12031.

In FIG. 22, imaging units 12101, 12102, 12103, 12104, and 12105 are provided as the imaging units 12031.

The imaging units 12101, 12102, 12103, 12104, and 12105 are provided at positions such as a front nose, side-view mirrors, a rear bumper, a back door, and an upper portion of a windshield in a vehicle interior of the vehicle 12100, for example. The imaging unit 12101 provided on the front nose and the imaging unit 12105 provided in the upper portion of the windshield in the vehicle interior mainly acquire images of the front of the vehicle 12100. The imaging units 12102 and 12103 provided on the side-view mirrors mainly acquire images of a lateral side of the vehicle 12100. The imaging unit 12104 provided on the rear bumper or the back door mainly acquires images of the rear of the vehicle 12100. The imaging unit 12105 provided in the upper portion of the windshield in the vehicle interior is mainly used for detection of preceding vehicles, pedestrians, obstacles, traffic signals, traffic signs, lanes, and the like.

FIG. 22 shows an example of imaging ranges of the imaging units 12101 to 12104. An imaging range 12111 indicates an imaging range of the imaging unit 12101 provided at the front nose, imaging ranges 12112 and 12113 respectively indicate the imaging ranges of the imaging units 12102 and 12103 provided at the side-view mirrors, and an imaging range 12114 indicates the imaging range of the imaging unit 12104 provided at the rear bumper or the back door. For example, by superimposing image data captured by the imaging units 12101 to 12104, it is possible to obtain a bird's-eye view image viewed from the upper side of the vehicle 12100.

At least one of the imaging units 12101 to 12104 may have a function for obtaining distance information. For example, at least one of the imaging units 12101 to 12104 may be a stereo camera constituted by a plurality of imaging devices or may be an imaging device that has pixels for phase difference detection.

For example, the microcomputer 12051 can extract, particularly, a closest three-dimensional object on a path through which the vehicle 12100 is traveling, which is a three-dimensional object traveling at a predetermined speed (for example, 0 km/h or higher) in the substantially same direction as the vehicle 12100, as a preceding vehicle by acquiring a distance to each three-dimensional object in the imaging ranges 12111 to 12114 and temporal change in the distance (a relative speed with respect to the vehicle 12100) on the basis of distance information obtained from the imaging units 12101 to 12104. Furthermore, the microcomputer 12051 can set the inter-vehicle distance to be secured in advance in front of the preceding vehicle, and perform automatic brake control (including following stop control) and automatic acceleration control (including following start control). Thus, it is possible to perform cooperative control for the purpose of, for example, automated driving in which the vehicle travels in an automated manner without requiring the driver to perform operations.

For example, the microcomputer 12051 can classify and extract three-dimensional data regarding three-dimensional objects into two-wheeled vehicles, normal vehicles, large vehicles, pedestrians, and other three-dimensional objects such as electric poles based on distance information obtained from the imaging units 12101 to 12104 and can use the three-dimensional data to perform automated avoidance of obstacles. For example, the microcomputer 12051 differentiates surrounding obstacles of the vehicle 12100 into obstacles which can be viewed by the driver of the vehicle 12100 and obstacles which are difficult to view. Then, the microcomputer 12051 determines a collision risk indicating the degree of risk of collision with each obstacle, and when the collision risk is equal to or higher than a set value and there is a possibility of collision, an alarm is output to the driver through the audio speaker 12061 or the display 12062, forced deceleration or avoidance steering is performed through the drive system control unit 12010, and thus it is possible to perform driving support for collision avoidance.

At least one of the imaging units 12101 to 12104 may be an infrared camera that detects infrared rays. For example, the microcomputer 12051 can recognize a pedestrian by determining whether there is a pedestrian in the captured image of the imaging units 12101 to 12104. Such pedestrian recognition is performed by, for example, a procedure in which feature points in the captured images of the imaging units 12101 to 12104 as infrared cameras are extracted and a procedure in which pattern matching processing is performed on a series of feature points indicating an outline of an object to determine whether or not the object is a pedestrian. When the microcomputer 12051 determines that there is a pedestrian in the captured images of the imaging units 12101 to 12104 and the pedestrian is recognized, the audio/image output unit 12052 controls the display 12062 so that a square contour line for emphasis is superimposed and displayed with the recognized pedestrian. In addition, the audio/image output unit 12052 may control the display 12062 so that an icon indicating a pedestrian or the like is displayed at a desired position.

An example of the vehicle control system to which the technology according to the present disclosure can be applied has been described above. The technology according to the present disclosure can be applied, for example, to each imaging unit 12031 among the components described above. Specifically, the solid-state imaging device 110 of FIG. 2 can be applied, for example, to the imaging unit 12031. By applying the technology according to the present disclosure to the imaging unit 12031, since it is possible to detect a fault in the solid-state imaging device 110 during imaging, it is possible to improve the safety and reliability of the system.

The above-described embodiments show examples for embodying the present technology, and matters in the embodiments and matters specifying the invention in the claims have a corresponding relationship with each other. Similarly, the matters specifying the invention in the claims and the matters in the embodiments of the present technology having the same name have a corresponding relationship with each other. However, the present technology is not limited to the embodiments and can be embodied by applying various modifications to the embodiments without departing from the gist thereof.

The effects described in the present specification are merely examples and are not intended as limiting, and other effects may be obtained.

The present technology can also have the following configurations.

(1) A solid-state imaging device including: an analog-to-digital converter that generates a digital signal within a predetermined video period;
a signal processing circuit that performs predetermined signal processing on the digital signal within the video period; and
a scan test circuit that performs a scan test on the signal processing circuit during a vertical blanking period that does not correspond to the video period.

(2) The solid-state imaging device according to (1), wherein the scan test circuit performs the scan test in each of a plurality of frame periods each including the vertical blanking period, and outputs an error notification indicating presence/absence of a fault in the signal processing circuit based on each test result.

(3) The solid-state imaging device according to (2), further including: a test pattern generation circuit that generates a predetermined test pattern based on an input seed value and inputs the test pattern to the signal processing circuit, wherein
the scan test circuit changes the seed value each time a frame period elapses.

(4) The solid-state imaging device according to any one of (1) to (3), wherein the scan test circuit includes first and second test circuits,
the signal processing circuit includes first and second processing units,
the first test circuit performs a scan test on the first processing unit, and
the second test circuit performs a scan test on the second processing unit.

(5) The solid-state imaging device according to any one of (1) to (4), further including: a fault detection circuit that detects presence/absence of a fault in the scan test circuit.

(6) The solid-state imaging device according to any one of (1) to (5), further including: a test pattern generation circuit that generates a predetermined test pattern based on an input seed value and inputs the test pattern to the signal processing circuit, wherein
the signal processing circuit includes:
a predetermined number of scan flip-flops; and
a combinational circuit that performs a predetermined logic operation on data output from the scan flip-flop.

(7) A vehicle control system including: a solid-state imaging device including an analog-to-digital converter that generates a digital signal within a predetermined video period, a signal processing circuit that performs predetermined signal processing on the digital signal within the video period, and a scan test circuit that performs a scan test on the signal processing circuit during a vertical blanking period that does not correspond to the video period; and
a control unit that stops the solid-state imaging device based on the result of the scan test.

(8) A control method for a solid-state imaging device, including: a digital signal generation procedure of generating a digital signal within a predetermined video period;
a signal processing procedure in which a signal processing circuit performs predetermined signal processing on the digital signal within the video period; and
a scan test procedure of performing a scan test on the signal processing circuit during a vertical blanking period that does not correspond to the video period.

REFERENCE SIGNS LIST

110 Solid-state imaging device
111 Pixel array unit
112 Analog-to-digital converter
113 Output interface
120 ECU
130 Display
200 Digital signal processor
210, 260 Scan test circuit
211 Timing controller
212 Seed value generator
213 Error detector
220 Scan LFSR
221, 251 Switch
222 LFSR
230 Controller
240 Signal processing circuit
250 Scan MISR
252 MISR
270 Fault detection circuit
300, 400 Processing unit
310, 350, 380 Combinational circuit
320, 330, 340, 360, 370 Scan flip-flop
321, 331, 341 Selector
322, 332, 342 Flip-flop
351 AND (logical product) gate
352 OR (logical sum) gate
12031 Imaging unit

The invention claimed is:

1. A solid-state imaging device, comprising:
an analog-to-digital converter configured to generate a digital signal within a specific video period;
a scan test circuit configured to generate a seed value;
a test pattern generation circuit configured to generate a specific test pattern based on the seed value from the scan test circuit; and
a signal processing circuit configured to:
perform a specific signal processing operation on the digital signal within the specific video period; and
receive the specific test pattern from the test pattern generation circuit, wherein the scan test circuit is further configured to:
perform a first scan test on the signal processing circuit during a vertical blanking period that does not correspond to the specific video period,
wherein the first scan test is performed in each frame period, of a plurality of frame periods, including the vertical blanking period;
change the seed value each time a frame period of the plurality of frame periods elapses; and
output an error notification that indicates one of a presence of a fault in the signal processing circuit or an absence of the fault in the signal processing circuit, based on the first scan test.

2. The solid-state imaging device according to claim 1, wherein
the scan test circuit includes a first test circuit and a second test circuit,
the signal processing circuit includes a first processing unit and a second processing unit,
the first test circuit is configured to perform a second scan test on the first processing unit, and
the second test circuit is configured to perform a third scan test on the second processing unit.

3. The solid-state imaging device according to claim 1, further comprising a fault detection circuit configured to detect one of a presence of a fault in the scan test circuit or an absence of the fault in the scan test circuit.

4. The solid-state imaging device according to claim 1, wherein the signal processing circuit includes:
a specific number of scan flip-flops; and
a combinational circuit configured to perform a specific logic operation on data output from the scan flip-flops.

5. A vehicle control system, comprising:
a solid-state imaging device including:
an analog-to-digital converter configured to generate a digital signal within a specific video period;
a scan test circuit configured to generate a seed value;
a test pattern generation circuit configured to generate a specific test pattern based on the seed value from the scan test circuit; and
a signal processing circuit configured to:
perform a specific signal processing operation on the digital signal within the specific video period; and
receive the specific test pattern from the test pattern generation circuit, wherein the scan test circuit is further configured to:
perform a scan test on the signal processing circuit during a vertical blanking period that does not correspond to the specific video period,
wherein the scan test is performed in each frame period, of a plurality of frame periods, including the vertical blanking period;
change the seed value each time a frame period of the plurality of frame periods elapses; and
output an error notification that indicates one of a presence of a fault in the signal processing circuit or an absence of the fault in the signal processing circuit, based on the scan test; and
a control unit configured to stop the solid-state imaging device based on a result of the scan test.

6. A control method for a solid-state imaging device, comprising:

generating, by an analog-to-digital converter, a digital signal within a specific video period;

generating, by a scan test circuit, a seed value;

generating, by a test pattern generation circuit, a specific test pattern based on the seed value from the scan test circuit;

performing, by a signal processing circuit, a specific signal processing on the digital signal within the specific video period;

receiving, by the signal processing circuit, the specific test pattern from the test pattern generation circuit;

performing, by the scan test circuit, a scan test on the signal processing circuit during a vertical blanking period that does not correspond to the specific video period, wherein the scan test is performed in each frame period, of a plurality of frame periods, including the vertical blanking period;

changing, by the scan test circuit, the seed value each time a frame period of the plurality of frame periods elapses; and outputting, by the scan test circuit, an error notification that indicates one of a presence of a fault in the signal processing circuit or an absence of the fault in the signal processing circuit, based on the scan test.

* * * * *